(12) United States Patent
Cai

(10) Patent No.: US 11,340,319 B2
(45) Date of Patent: May 24, 2022

(54) MAGNETIC SENSOR DEVICE

(71) Applicant: TDK Corporation, Tokyo (JP)

(72) Inventor: Yongfu Cai, Tokyo (JP)

(73) Assignee: TDK Corporation, Tokyo (JP)

( * ) Notice: Subject to any disclaimer, the term of this patent is extended or adjusted under 35 U.S.C. 154(b) by 50 days.

(21) Appl. No.: 16/578,490

(22) Filed: Sep. 23, 2019

(65) Prior Publication Data

US 2020/0166590 A1 May 28, 2020

(30) Foreign Application Priority Data

Nov. 26, 2018 (JP) .............................. JP2018-220015

(51) Int. Cl.
*G01R 33/09* (2006.01)
*G01D 5/16* (2006.01)

(52) U.S. Cl.
CPC ............ *G01R 33/093* (2013.01); *G01D 5/16* (2013.01)

(58) Field of Classification Search
CPC ................................ G01R 33/093; G01D 5/16
See application file for complete search history.

(56) References Cited

U.S. PATENT DOCUMENTS

| | | |
|---|---|---|
| 6,529,140 B1 | 3/2003 | Sax et al. |
| 2006/0261802 A1 | 11/2006 | Oohashi et al. |
| 2009/0027048 A1 | 1/2009 | Sato et al. |
| 2010/0013465 A1 | 1/2010 | Sautter et al. |
| 2010/0118447 A1* | 5/2010 | Hammerschmidt ... B82Y 25/00 360/315 |
| 2012/0268113 A1 | 10/2012 | Sato et al. |
| 2017/0184687 A1 | 6/2017 | Ostrick et al. |

FOREIGN PATENT DOCUMENTS

| | | |
|---|---|---|
| CN | 102262167 A | 11/2011 |
| JP | H11-083418 A | 3/1999 |
| JP | 2002-303536 A | 10/2002 |
| JP | 2006-250857 A | 9/2006 |
| JP | 2006-276983 A | 10/2006 |

(Continued)

OTHER PUBLICATIONS

JP2006250857A English Machine translation, download from ESPACENET (Year: 2006).*

(Continued)

*Primary Examiner* — Minh Q Phan
(74) *Attorney, Agent, or Firm* — Posz Law Group, PLC

(57) ABSTRACT

A magnetic sensor device has a multipolar magnet having a first surface and a second surface, which is opposite to the first surface, in which magnetic poles of differing polarity are arranged alternately to divide the first surface radially into n regions (where n>4), and a magnetic detection part provided to be opposite to the first surface of the multipolar magnet. The multipolar magnet is provided to be capable of relative movement in at least one direction in a plane substantially parallel to the first surface and the second surface. The magnetic detection part outputs a signal corresponding to change in the magnetic field accompanying relative movement of the multipolar magnet, and the geometric centers of the multipolar magnet and the magnetic detection part substantially match in a direction orthogonal to the first surface.

7 Claims, 8 Drawing Sheets

(56) References Cited

FOREIGN PATENT DOCUMENTS

| JP | 2007-212275 A | 8/2007 |
|----|---------------|--------|
| JP | 2015-000222 A | 1/2015 |
| JP | 2015-21790 A | 2/2015 |

OTHER PUBLICATIONS

Office Action dated Sep. 29, 2020 issued in corresponding JP patent application No. 2018-220015 (English translation only).
Japanese Office Action dated Mar. 9, 2021, issued in corresponding Japanese patent application 2018-220015 (and English machine translation).
English Machine Translation of Japanese Office Action dated Jul. 20, 2021, issued in corresponding JP Patent Application No. 2018-220015.
English Machine Translation of Chinese Office Action dated Sep. 26, 2021, issued in corresponding CN Patent Application No. 201911165205.4.

\* cited by examiner

MAGNETIC SENSOR DEVICE

CROSS REFERENCE TO RELATED APPLICATIONS

The present application is based on Japanese Patent Application No. 2018-220015 filed on Nov. 26, 2018, the disclosure of which is incorporated herein by reference.

TECHNICAL FIELD

The present invention relates to a magnetic sensor device.

BACKGROUND

In recent years, in a variety of applications, physical quantity detection devices (position detection devices) for detecting physical quantities (for example, position and movement amount (change amounts) or the like caused by rotational movement or linear movement of a moving body) have been used. As such a physical quantity detection device, one equipped with a magnetic sensor capable of detecting change in an external magnetic field, is known, and a signal in accordance with the change in the external magnetic field is output from the magnetic sensor.

The magnetic sensor device includes a magnetic field generation part that generates a detected magnetic field and a magnetic sensor element for detecting the detected magnetic field. Change in the magnetic field caused by movement of the magnetic field generation part is detected by the magnetic sensor element. As such, a magnetic sensor element, a magnetoresistive effect element (AMR element, GMR element, TMR element or the like) in which resistance changes in accordance with change in the external magnetic field, or a Hall element that utilizes the so-called Hall effect, or the like, is known.

Conventionally, as a magnetic sensor device used in a pointing device that detects movement in two axial directions (X axis and Y axis) in a plane, one is known (see Patent Literature 1) that has first through fourth GMR elements and a magnet (bipolar magnet with an N pole and an S pole) magnetized in the direction of thickness and provided opposite these elements, with the direction of magnetization of the fixed layer of the first through fourth GMR elements being, in order, the positive X-axis direction (+X direction), the negative X-axis direction (−X direction), positive Y-axis direction (+Y direction) and negative Y-axis direction (−Y direction).

RELATED LITERATURE

Patent Literature

[PATENT LITERATURE 1] JP Laid-Open Patent Application No. 2006-276983.

OVERVIEW OF THE INVENTION

Problem to be Solved by the Invention

In the aforementioned magnetic sensor device, the directions of magnetization of the fixed layers in the four GMR elements (first through fourth GMR elements) differ, so the amount of movement of the magnet (position of the magnet) can be found based on change in the resistance values of the GMR elements accompanying movement of the magnet in the X-axis direction (±X directions) and Y-axis direction (±Y directions).

However, in the aforementioned magnet, the linearity of displacement of magnetic field intensity with movement (displacement of the magnet) in each of the X-axis direction (±X directions) and Y-axis direction (±Y directions) from the geometric center thereof is low. Consequently, the linearity of change in the resistance value of each of each of the GMR elements accompanying movement of the magnet and the output signal based thereon is low, creating the problem that position detection accuracy falls.

In addition, in the aforementioned magnetic sensor device, the GMR elements are arranged at the four corners of a roughly square substrate, but because of the positional deviation between the geometric center of that substrate and the geometric center of the magnet (deviation in the positional relationship between the substrate and the magnet in the initial state), the change in the resistance value of each of the GMR elements and the output signal based thereon change greatly, creating the problem that position detection accuracy falls.

In consideration of the foregoing, it is an object of the present invention to provide a magnetic sensor device capable of accomplishing with high accuracy position detection through the relative movement of a magnet on at least one axis (the X axis) and preferably two axes (the X axis and Y axis).

Means for Solving the Problem

In order to resolve the above-described problem, the present invention provides a magnetic sensor device including a multipolar magnet having a first surface and a second surface, which is opposite to the first surface, and in which magnetic poles of differing polarity are arranged alternately to partition the first surface radially into n regions (where n is an integer not smaller than 4) and a magnetic detection part provided to be opposite to the first surface of the multipolar magnet. The multipolar magnet is provided to be capable of relative movement in at least one direction in a plane substantially parallel to the first surface and the second surface. The magnetic detection part outputs a signal corresponding to change in the magnetic field accompanying relative movement of the multipolar magnet, and the geometric centers of the multipolar magnet and the magnetic detection part substantially match in a direction orthogonal to the first surface.

In the above-described magnetic sensor device, the multipolar magnet should be provided to be capable of relative movement in a second direction orthogonal to the first direction within the plane. The magnetic detection part may output a signal corresponding to change in the magnetic field accompanying relative movement of the multipolar magnet in the first direction and/or the second direction. Preferably, the magnetic detection part outputs a signal corresponding to change in the magnetic field in the second direction accompanying relative movement of the multipolar magnet in the first direction and outputs a signal corresponding to change in the magnetic field in the first direction accompanying relative movement of the multipolar magnet in the second direction.

In the above-described magnetic sensor device, the multipolar magnet may include a neutral zone that is not magnetized to the polarity of either magnetic pole, between the magnetic poles of differing polarity. The magnetic detection part may be provided to have a prescribed interval from the first surface of the multipolar magnet, and the interval between the magnetic detection part and the first surface of the multipolar magnet should be 0.1~5 mm.

In the above-described magnetic sensor device, as the magnetic detection part, one having a magnetic detection element that includes a magnetization fixed layer in which the magnetization direction is fixed can be used. The magnetic detection part has a plurality of the magnetic detection elements. The magnetization direction of the magnetization fixed layer of one of the magnetic detection elements may be substantially parallel to the first direction, and the magnetization direction of the magnetization fixed layer of another of the magnetic detection elements may be substantially parallel to the second direction. As the magnetic detection element, a TMR element, a GMR element or an AMR element can be used.

The present invention provides a multipolar magnet that is a multipolar magnet having a first magnetic pole and a second magnetic pole of mutually differing polarity, and the multipolar magnet has a first surface and a second surface, which is opposite to the first surface. When viewed from the first surface side, the first magnetic pole and the second magnetic pole are arranged alternately to divide the first surface radially into n regions (where n is an integer not smaller than 4).

In the above-described multipolar magnet, when viewed from the first surface side, n/2 first magnetic poles and n/2 second magnetic poles may be arranged alternately to divide the first surface radially into n regions (where n is an even number not smaller than 4). When viewed from the second surface side, the second magnetic pole may be positioned opposite to each of the first magnetic poles positioned on the first surface side, and the first magnetic pole may be positioned opposite to each of the second magnetic poles positioned on the first surface side. The multipolar magnet may have a neutral zone positioned between the first magnetic pole and second magnetic pole adjacent to each other.

Efficacy of the Invention

With the present invention, it is possible to provide a magnetic sensor device capable of performing position detection by the relative movement of a magnet on at least one axis (the X axis) and preferably two axes (the X axis and Y axis) with high accuracy.

EMBODIMENT(S) OF THE INVENTION

Figure 1:
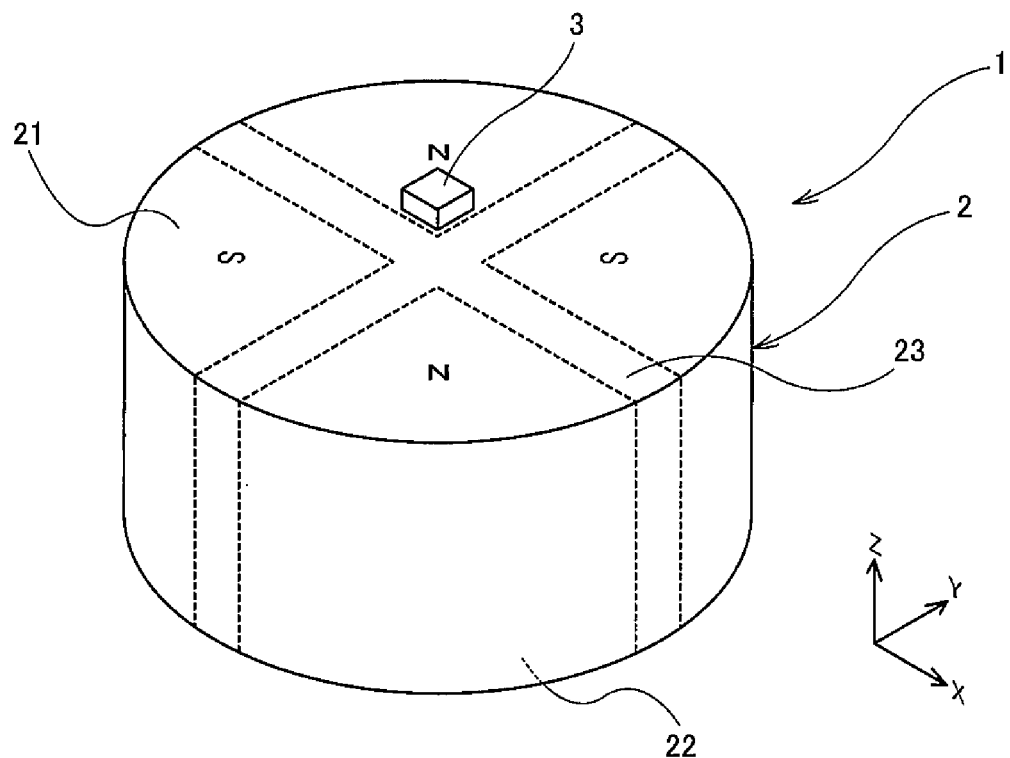
FIG. 1 is a perspective view showing a schematic configuration of a magnetic sensor device according to an embodiment of the present invention.
Figure 2:
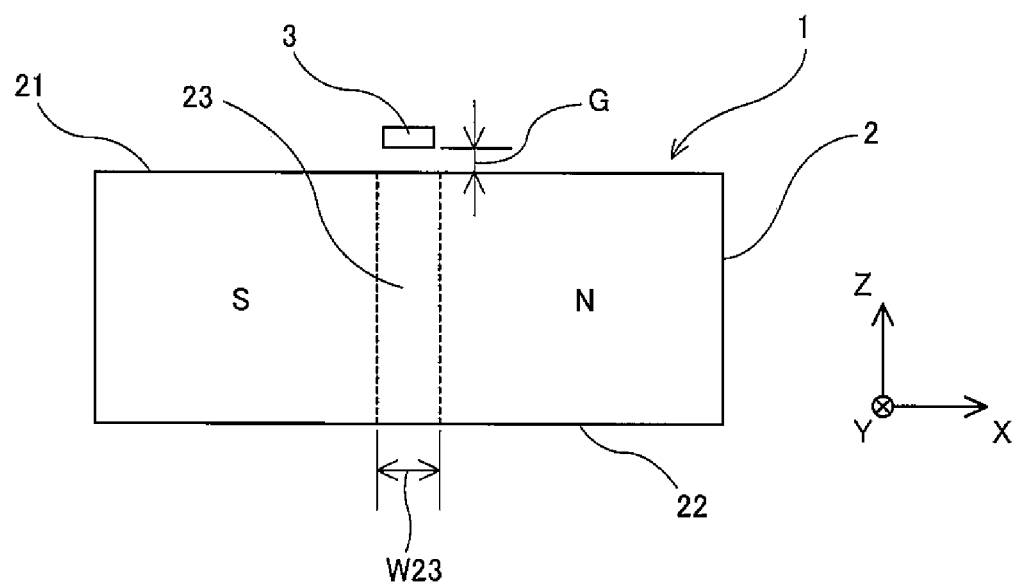
FIG. 2 is a side view showing a schematic configuration of the magnetic sensor device according to an embodiment of the present invention.
Figure 3:
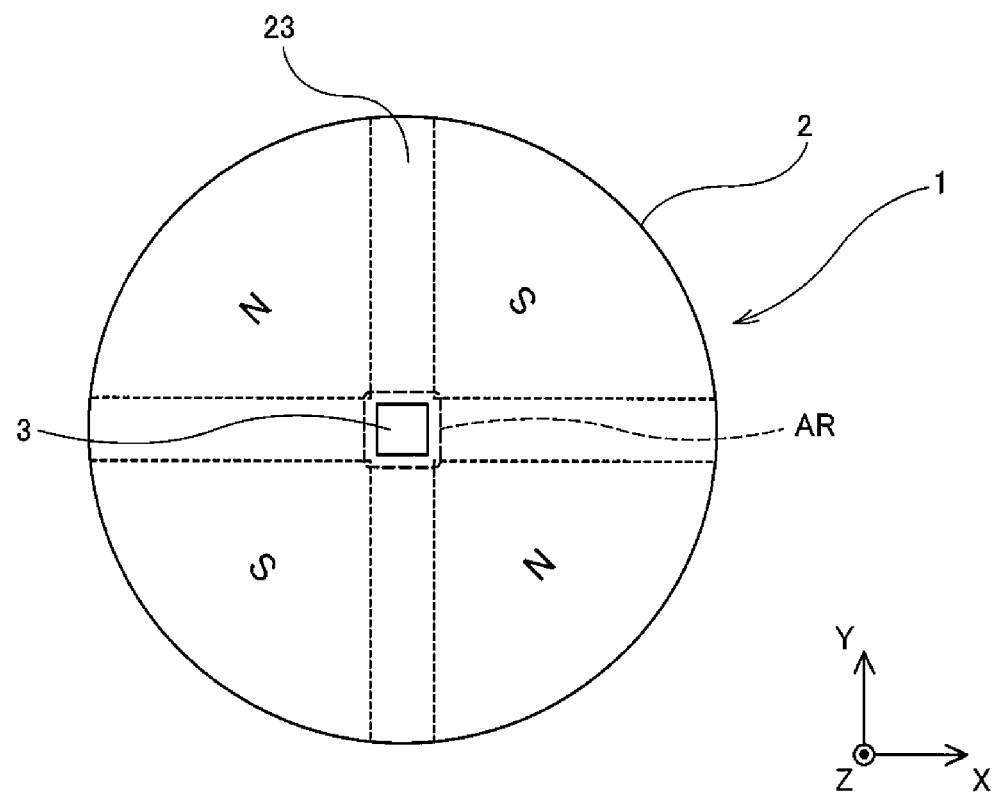
FIG. 3 is a plan view showing a schematic configuration of the magnetic sensor device according to an embodiment of the present invention.
Figure 4:
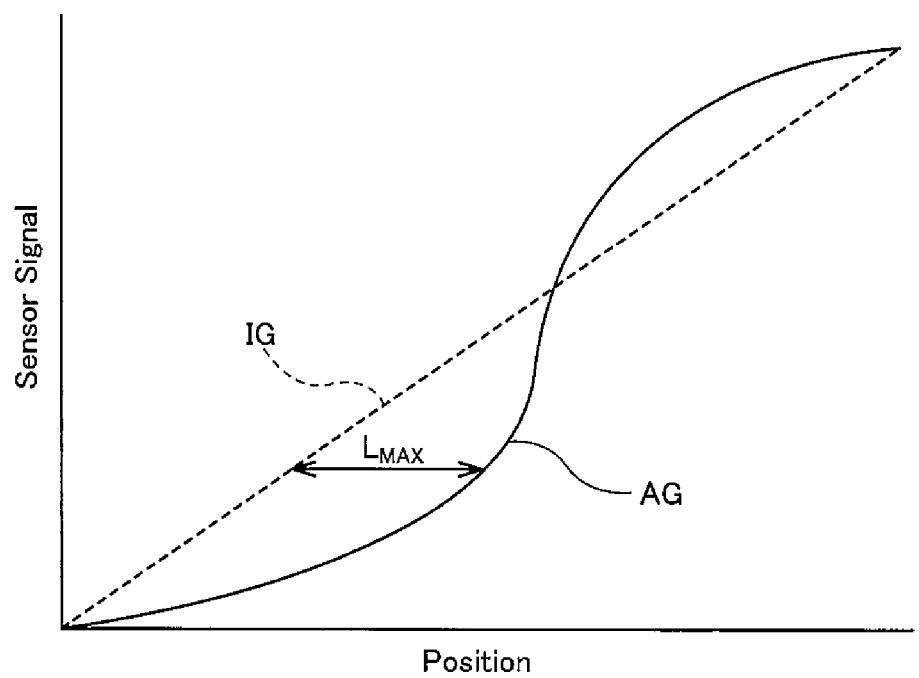
FIG. 4 is a graph for describing the linearity of the change in the sensor signal in the magnetic sensor device according to an embodiment of the present invention.
Figure 5:
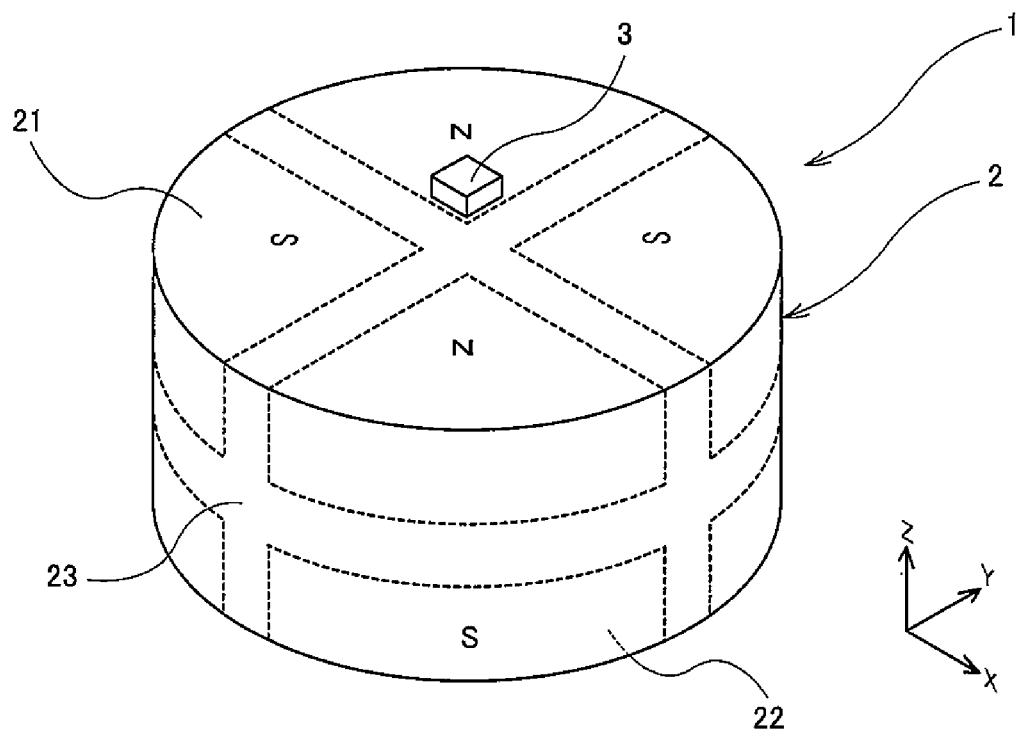
FIG. 5 is a perspective view showing a schematic configuration of a magnetic sensor device according to another embodiment of the present invention.
Figure 6:
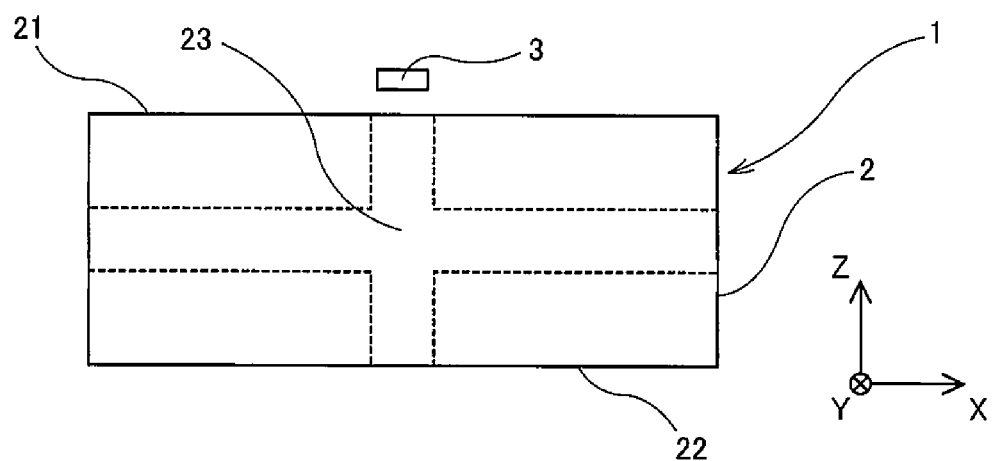
FIG. 6 is a side view showing a schematic configuration of the magnetic sensor device according to another embodiment of the present invention.
Figure 7:
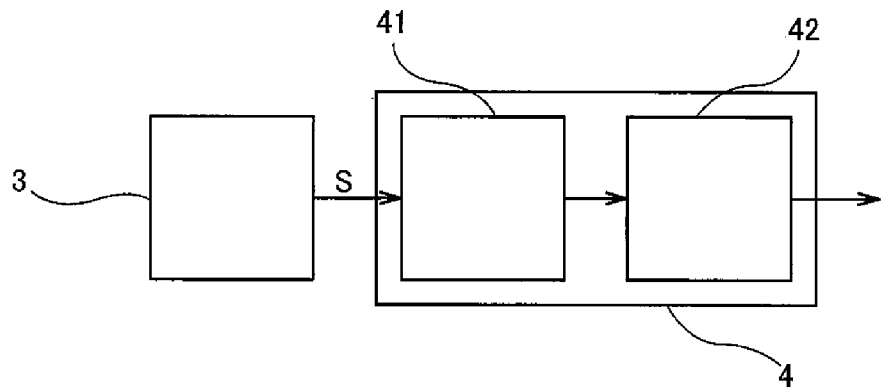
FIG. 7 is a block diagram showing a schematic configuration of the magnetic sensor device according to an embodiment of the present invention.
Figure 8:
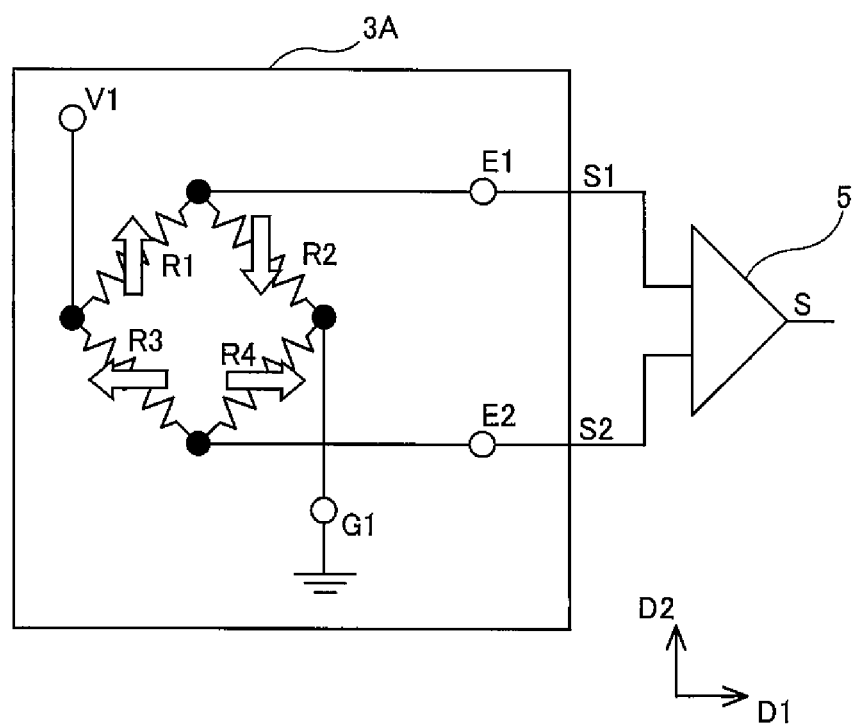
FIG. 8 is a circuit diagram showing a schematic configuration of one aspect of the circuit configuration possessed by the magnetic sensor device according to an embodiment of the present invention.

An embodiment of the present invention will be described with reference to the drawings. FIG. 1 is a perspective view showing a schematic configuration of a magnetic sensor device according to this embodiment, FIG. 2 is a side view showing a schematic configuration of the magnetic sensor device according to this embodiment, FIG. 3 is a plan view showing a schematic configuration of the magnetic sensor device according to this embodiment, FIG. 4 is a graph for describing the linearity of the change in the sensor signal in the magnetic sensor device according to this embodiment, FIG. 5 is a perspective view showing a schematic configuration of a magnetic sensor device according to another embodiment, FIG. 6 is a side view showing a schematic configuration of the magnetic sensor device according to another embodiment, FIG. 7 is a block diagram showing a schematic configuration of the magnetic sensor device according to this embodiment, and FIG. 8 is a circuit diagram showing a schematic configuration of one aspect of the circuit configuration possessed by the magnetic sensor device according to this embodiment.

In the magnetic sensor device according to this embodiment, the "X-axis direction, Y-axis direction and Z-axis direction" are stipulated in a number of the drawings as necessary. Here, the X-axis direction and the Y-axis direction are mutually orthogonal directions within a plane substantially parallel to a first surface and a second surface of a multipolar magnet in this embodiment, and the Z-axis direction is the direction of thickness of the multipolar magnet (the direction orthogonal to the first surface and the second surface of the multipolar magnet).

A magnetic sensor device 1 according to this embodiment is provided with a multipolar magnet 2 having a first surface 21 and a second surface 22 opposed thereto, a magnetic detection part 3 provided to face the first surface 21 of the multipolar magnet 2 and outputting a sensor signal S in accordance with the relative movement of the multipolar magnet 2, and a calculation processing part 4 that calculates a relative movement amount (physical quantity) of the multipolar magnet 2, based on the sensor signal S output from the magnetic detection part 3.

When viewed from the first surface 21 side, the multipolar magnet 2 is such that magnetic poles of differing polarity (N poles and S poles) are alternately arranged to divide the first surface 21 into n (where n is an integer that is at least 4) radial regions. For example, as shown in FIGS. 1-3, the multipolar magnet 2 may be a magnet magnetized into four poles in which two N poles and two S poles are alternately arranged to divide the first surface 21 into four radial regions. The state of the multipolar magnet 2 is not limited to this state, but it may be a magnet magnetized into six poles in which three N poles and three S poles are alternately arranged to divide the first surface 21 into six radial regions, or may be a magnet magnetized into eight poles in which two N poles and two S poles are alternately arranged to divide the first surface 21 side into four radial regions and the second surface 22 side is a magnet magnetized in eight poles in which two N poles and S poles differing in polarity from the first surface side 21 are alternately arranged (see FIG. 5 and FIG. 6).

The multipolar magnet 2 of this embodiment includes a neutral zone 23 that is not magnetized with either polarity, between the magnetic poles (N poles and S poles) of mutually differing polarity. Because the multipolar magnet 2 includes a neutral zone 23, the relative positional relationship between the multipolar magnet 2 and the magnetic detection part 3 (the positional relationship in the initial state) does not have a great effect on the sensor signal S output from the magnetic detection part 3 positioned opposite the first surface 21. That is, the sensor signal S output from the magnetic detection part 3 substantially does not change through the relative positional relationship in the initial state between the multipolar magnet 2 and the magnetic detection part 3. The width W23 of this neutral zone 23 is about 0.1~10 mm, and may be about 0.3~3 mm.

In this embodiment, the multipolar magnet 2 is provided to be capable of moving relative to the magnetic detection part 3, in a first direction (X-axis direction) D1 within a plane substantially parallel to the first surface 21 and the second surface 22 and in a second direction (Y-axis direction) D2 orthogonal thereto. The multipolar magnet 2 may be capable of moving relatively to either one of the first direction (X-axis direction) D1 or the second direction (Y-axis direction) D2. In addition, the multipolar magnet 2 may be provided to be capable of moving in the first direction (X-axis direction) D1, and the magnetic detection part 3 may be provided to be capable of moving in the second direction (Y-axis direction) D2.

In this embodiment, the shape of the multipolar magnet 2 is roughly cylindrical with the first surface 21 and the second surface 22 being roughly circular, but this is intended to be illustrative and not limiting. The shape of the multipolar magnet 2 may, for example, be roughly a prismatic shape in which the first surface 21 and the second surface 22 are shaped such that the roughly rectangular, roughly cross-shaped or roughly square shaped sides are curved or bent toward the inside thereof. The shape when viewed from the first surface 21 or second surface 22 side preferably has roughly n-fold symmetry (where n is an even number that is at least 2). By giving roughly n-fold symmetry to the shape when viewed from the first surface 21 or second surface 22 side, when the multipolar magnet 2 moves relatively in the first direction D1 (for example, in the +X direction) and moves relatively in the direction opposite thereto (for example, the −X direction), the intensity of the magnetic field generated by the multipolar magnet 2 can be changed almost uniformly. When the shape of the multipolar magnet 2 is roughly cylindrical, the diameter of the first surface 21 (or the second surface 22) of the multipolar magnet 2 may be around 1~12 mm, and the thickness of the multipolar magnet 2 may be around 0.3~6 mm.

The magnetic detection part 3 is a part that outputs the sensor signal S in accordance with change in the magnetic field (the magnetic field generated from the multipolar magnet 2) accompanying relative movement of the multipolar magnet 2 (movement in the first direction D1 and the second direction D2) and is provided with a prescribed gap G with respect to the first surface 21 of the multipolar magnet 2. The gap G between the magnetic sensor part 3 and the first surface 21 of the multipolar magnet 2 is, for example, around 0.1~10 mm, and preferably around 0.1~5 mm. The gap G is the length in the Z-axis direction between the first surface 21 of the multipolar magnet 2 and the magnetic detection part 3.

When viewed along a direction orthogonal to the first surface 21 of the multipolar magnet 2, the magnetic detection part 3 is provided such that the geometric center thereof and the geometric center of the first surface 21 of the multipolar magnet 2 substantially match. By having the geometric centers substantially match each other, it is possible to cause the sensor signal S output from the magnetic detection part 3 to change linearly in accordance with change in the magnetic field accompanying relative movement of the multipolar magnet 2 in the first direction D1 and the second direction D2. That is, it is possible to improve the linearity of change in the sensor signal S output from the magnetic detection part 3. Here, "the geometric centers substantially match each other" means that the geometric centers of the magnetic detection part 3 and the first surface 21 of the multipolar magnet 2 match each other to the extent that it is possible to cause the sensor signal S to change linearly, and preferably, the linearity of these geometric centers match to such an extent that change in the sensor signal S accompanying relative movement of the multipolar magnet 2 is 100 μm or less, and more preferably, 30 μm or less. In addition, the linearity of change in the sensor signal S means the maximum value of the difference between the ideal change in the sensor signal S with relative movement of the multipolar magnet 2 (change in the relative position of the magnetic detection part 3), and the actual change in the sensor signal S.

For example, the linearity of change in the sensor signal S is found as follows. First, from a state in which the geometric centers of the first surface 21 of the multipolar magnet 2 and the magnetic detection part 3 match each other, a graph IG is created in which the ideal change in the sensor signal S when the multipolar magnet 2 is caused to move relatively within the range of ±300 μm in both the ±X direction (first direction D1) and the ±Y direction (second direction D2) is expressed by a linear function. The ideal change in the sensor signal S means the change in the sensor signal S accompanying relative movement of the multipolar magnet 2 when the first surface 21 and the second surface 22 of the multipolar magnet 2 are an ideal shape (for example, a perfect circle, a square or the like) and the distribution of the magnetic field generated by the multipolar magnet 2 is uniform in the first surface 21. Next, a graph AG of the change in the sensor signal S when the multipolar magnet 2 is actually moved relatively within a range of ±300 µm in both the ±X direction (first direction D1) and the ±Y direction (second direction D2) is superimposed on the graph IG, and the maximum value $L_{MAX}$ of the absolute value of the difference in the relative positions between the graph AG and the graph IG is found (see FIG. 4). The maximum value $L_{MAX}$ found in this manner can be deemed the linearity of the change in the sensor signal S.

Accordingly, in this embodiment, the magnetic detection part 3 should be provided such that the geometric center of the magnetic detection part 3 is positioned within the region AR (the region viewed from the first surface 21 side of the multipolar magnet 2) the geometric center of which matches that of the first surface 21 of the multipolar magnet 2 to the extent that the sensor signal S can be caused to change linearly. This region AR may be a region of around 0.2~5 mm×0.2~5 mm in size.

The magnetic detection part 3 has a first magnetic detection element part R1, a second magnetic detection element part R2, a third magnetic detection element part R3 and a fourth magnetic detection element part R4, and outputs a first sensor signal 51 and a second sensor signal S2 based on change in the magnetic field accompanying relative movement of the multipolar magnet 2. The first sensor signal 51 and the second sensor signal S2 are output to the calculation processing part 4 as the sensor signal S via a difference detector 5.

The calculation processing part 4 includes an A/D (analog-digital) converter 41 that converts the analog signal (sensor signal S) output from the magnetic detection part 3 into a digital signal, and a calculation part 42 that processes the digital signal digitally converted by the A/D converter 41 and calculates the relative movement amount (physical quantity) of the multipolar magnet 2.

The first through fourth magnetic detection element parts R1~R4 the magnetic detection part 3 has respectively include at least one magnetic detection element or may have a configuration in which a plurality of magnetic detection elements is connected in series. In this embodiment, the magnetic detection part 3 has a Wheatstone bridge circuit 3A that includes pairs of magnetic detection elements connected in series.

As shown in FIG. 8, the Wheatstone bridge circuit 3A the magnetic detection part 3 has includes a power source port V1, a ground port G1, two output ports E1 and E2, first and second magnetic detection element parts R1 and R2 connected in series, and third and fourth magnetic detection element parts R3 and R4 connected in series. One end of each of the first and third magnetic detection element parts R1 and R3 is connected to the power source port V1. The other end of the first magnetic detection element part R1 is connected to one end of the second magnetic detection element part R2 and the output port E1. The other end of the third magnetic detection element part R3 is connected to one end of the fourth magnetic detection element part R4 and the output port E2. The other end of each of the second and fourth magnetic detection element parts R2 and R4 is connected to the ground port G1. A power source voltage of prescribed magnitude is applied to the power source port V1, and the ground port G1 is connected to ground.

In this embodiment, MR elements such as TMR elements, GMR elements, AMR elements or the like can be used as the magnetic detection elements configuring the first through fourth magnetic detection element parts R1~R4 included in the Wheatstone bridge circuit 3A, and using TMR elements is particularly preferable. TMR elements and GMR elements include a magnetization fixed layer in which the magnetization direction is fixed, a free layer in which the magnetization direction changes in accordance with the direction of an impressed magnetic field, and a nonmagnetic layer positioned between the magnetization fixed layer and the free layer. AMR elements include a magnetic layer having shape anisotropy.

Figure 9:
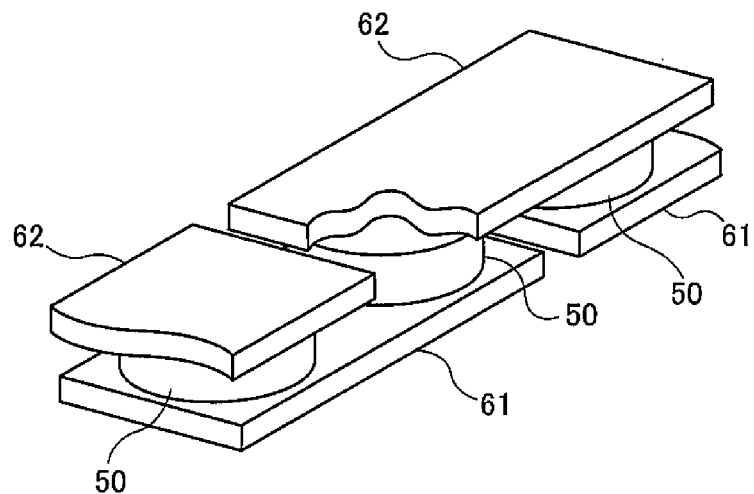
FIG. 9 is a perspective view showing a schematic configuration of a magnetic sensor element according to an embodiment of the present invention.
Figure 10:
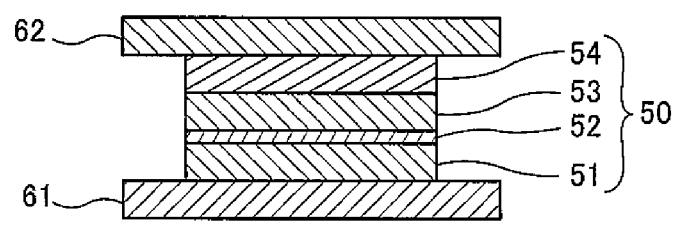
FIG. 10 is a cross-sectional view showing a schematic configuration of the magnetic sensor element according to an embodiment of the present invention.

When the MR elements are TMR elements or GMR elements, as shown in FIG. 9 the MR elements have a plurality of lower electrodes 61, a plurality of MR films 50 and a plurality of upper electrodes 62. The plurality of lower electrodes 61 is provided on a substrate (not depicted). Each of the lower electrodes 61 has a long, slender shape. A gap is formed between two lower electrodes 61 adjacent in the lengthwise direction of the lower electrodes 61. The MR film 50 is provided on the top surface of the lower electrodes 61 in the vicinity of both ends in the lengthwise direction. As shown in FIG. 10, the MR film 50 has a planar circular shape and includes a free layer 51, a nonmagnetic layer 52, a magnetization fixed layer 53 and an antiferromagnetic layer 54 layered in that order from the lower electrode 61 side. The free layer 51 is electrically connected to the lower electrode 61. The antiferromagnetic layer 54 is configured by an antiferromagnetic material and, by creating exchange-coupling with the magnetization fixed layer 53, serves the role of fixing the direction of magnetization of the magnetization fixed layer 53. The plurality of upper electrodes 62 is provided on top of the plurality of MR films 50. The upper electrodes 62 respectively have a long, slender shape, are positioned above two of the lower electrodes 61 adjacent in the lengthwise direction of the lower electrodes 61, and electrically connect the antiferromagnetic layers 54 of two adjacent MR films 50. The MR films 50 may also have a configuration in which the free layer 51, the nonmagnetic layer 52, the magnetization fixed layer 53 and the antiferromagnetic layer 54 are layered in that order from the upper electrode 62 side. In addition, the antiferromagnetic layer 54 may be omitted, by having a so-called self-pinned fixed layer (Synthetic Ferri Pinned (SFP) layer) in which the magnetization fixed layer 53 has a layered ferri structure of a ferromagnetic layer/nonmagnetic intermediate layer/ferromagnetic layer, and the two ferromagnetic layers are antiferromagnetic ally coupled.

In TMR elements, the nonmagnetic layer 52 is a tunnel barrier layer. In GMR elements, the nonmagnetic layer 52 is a nonmagnetic conductive layer. In TMR elements and GMR elements, the resistance value changes in accordance with the angle formed by the direction of magnetization of the free layer 51 with respect to the direction of magnetization of the magnetization fixed layer 53, and the resistance value is a minimum when this angle is 0° (when the magnetization directions are parallel to each other), and the resistance value is a maximum when this angle is 180° (when the magnetization directions are antiparallel to each other).

In FIG. 8, when the magnetic detection elements configuring the first through fourth magnetic detection element parts R1~R4 are TMR elements or GMR elements, the magnetization direction of the magnetization fixed layers 53 thereof are indicated by the filled-in arrows. In the Wheatstone bridge circuit 3A of the magnetic detection part 3, the magnetization directions of the magnetization fixed layers 53 of the magnetic detection elements R1 and R2 are parallel to the second direction (Y-axis direction) D2, and the magnetization direction of the magnetization fixed layer 53 of the magnetic detection element R1 and the magnetization direction of the magnetization fixed layer 53 of the magnetic detection element R2 are antiparallel to each other. In addition, the magnetization directions of the magnetization fixed layers 53 of the magnetic detection elements R3 and R4 are parallel to the first direction (X-axis direction) D1, and the magnetization direction of the magnetization fixed layer 53 of the magnetic detection element R3 and the magnetization direction of the magnetization fixed layer 53 of the magnetic detection element R4 are antiparallel to each other. In the magnetic detection part 3, the potential difference between the output ports E1 and E2 changes in accordance with the change in the direction of the magnetic field accompanying relative movement of the multipolar magnet 2, and the sensor signal S is output to the calculation processing part 4 as a signal indicating the magnetic field intensity. When the multipolar magnet 2 moves relatively in the second direction (Y-axis direction) D2, the magnetic field in the first direction (X-axis direction) D1 generated by the multipolar magnet 2 and applied to each of the magnetic detection elements R1~R4 changes. Accompanying this, the resistance values of the magnetic detection elements R1 and R2 change, but the resistance values of the magnetic detection elements R3 and R4 do not change. The signal corresponding to the potential difference between the output ports E1 and E2 created by this is output to the calculation processing part 4 as the sensor signal S. In addition, when the multipolar magnet 2 moves relatively in the first direction (X-axis direction) D1, the magnetic field in the second direction (Y-axis direction) D2 generated by the multipolar magnet 2 and applied to each of the magnetic detection elements R1~R4 changes. Accompanying this, the resistance values of the magnetic detection elements R3 and R4 change, but the resistance values of the magnetic detection elements R1 and R2 do not change. The signal corresponding to the potential difference between the output ports E1 and E2 created by this is output to the calculation processing part 4 as the sensor signal S. The difference detector 5 outputs a signal corresponding to the potential difference between the output ports E1 and E2 to the A/D converter 41 of the calculation processing part 4 as the sensor signal S.

As described above, the magnetization directions of the magnetization fixed layers 53 of the magnetic detection elements R1 and R2 of the magnetic detection part 3 and the magnetization directions of the magnetization fixed layers 53 of the magnetic detection elements R3 and R4 are mutually orthogonal. Through this, detecting the magnetic field in the X-axis direction and the magnetic field in the Y-axis direction generated from the multipolar magnet 2 is possible with a single magnetic detection part 3.

The A/D converter 41 converts the sensor signal S (analog signal corresponding to movement amount) output from the magnetic detection part 3 into a digital signal, and this digital signal is input into the calculation part 42. The calculation part 42 accomplishes calculation processing on the digital signal converted from the analog signal by the A/D converter 41 and calculates the relative movement amount of the multipolar magnet 2. This calculation part 42 is configured by, for example, a microcomputer, an Application Specific Integrated Circuit (ASIC), or the like.

As described above, in this embodiment, when the multipolar magnet 2 moves relatively in the first direction (X-axis direction) D1, the intensity of the magnetic field in the second direction (Y-axis direction) D2 generated by the multipolar magnet 2 and applied to each of the magnetic detection elements R1~R4 gradually changes. Through this, the magnetization directions of the free layers 51 of the magnetic detection elements R1 and R2 gradually change, so the sensor signal S output in accordance with the potential difference between the output ports E1 and E2 changes linearly. On the other hand, when the multipolar magnet 2 moves relatively in the second direction (Y-axis direction) D2, the intensity of the magnetic field in the first direction (X-axis direction) D1 generated by the multipolar magnet 2 and applied to each of the magnetic detection elements R1~R4 gradually changes. Through this, the magnetization directions of the free layers 51 of the magnetic detection elements R3 and R4 gradually change, so the sensor signal S output in accordance with the potential difference between the output ports E1 and E2 changes linearly. Consequently, with the magnetic sensor device 1 according to this embodiment, position detection through relative movement of the multipolar magnet 2 in the two axial directions (X-axis direction and Y-axis direction) can be accomplished with high accuracy. In addition, because the multipolar magnet 2 has a neutral zone 23, fluctuations in the properties (positional detection accuracy) of the magnetic sensor device 1 caused by positional deviation of the magnetic detection part 3 (positional deviation between the geometric centers of the multipolar magnet 2 and the magnetic detection part 3 from each other when viewed along the Z-axis direction) can be reduced.

Accordingly, the magnetic sensor device 1 having the above-described configuration can accomplish positional detection through relative movement of the multipolar magnet 2 in the two axial directions (X-axis direction and Y-axis direction) with high accuracy, and thus can be appropriately used as a position detection device or the like in a lens driving mechanism (optical system hand-shake correction mechanism) in an imaging device such as a camera or the like, or in a joystick input mechanism.

The embodiment as described above was presented in order to facilitate understanding of the invention and is intended to be illustrative of and not limiting to the present invention. Accordingly, each of the components disclosed in the above-described embodiment includes all equivalents and design modifications falling within the technical scope of the present invention.

In the above-described embodiment, the description took, as an example, a magnetic sensor device 1 capable of detecting relative movement amounts of the multipolar magnet 2 in the two axial directions (X-axis direction and Y-axis direction), but this is intended to be illustrative and not limiting. For example, the magnetic sensor device 1 may be used as a device capable of detecting relative movement amounts of the multipolar magnet 2 in one axial direction (the X-axis direction or the Y-axis direction).

In the above-described embodiment, the description took, as an example, a magnetic sensor device 1 having a multipolar magnet 2 including a neutral zone 23, but this is intended to be illustrative and not limiting. For example, the multipolar magnet 2 the magnetic sensor device 1 may be one that does not include a neutral zone 23. In this case, fluctuations in the sensor signal S caused by the relative positional relationship (positional relationship in the initial state) between the multipolar magnet 2 and the magnetic detection part 3 tend to be large in comparison to a magnetic sensor device 1 having a multipolar magnet 2 that includes a neutral zone 23, so the size of the region AR where the magnetic detection part 3 can be provided is made smaller.

EMBODIMENT(S)

Below, the present invention will be described in greater detail by citing embodiments, but the present invention is not limited in any manner by the below-described embodiments.

Embodiment 1

Figure 11:
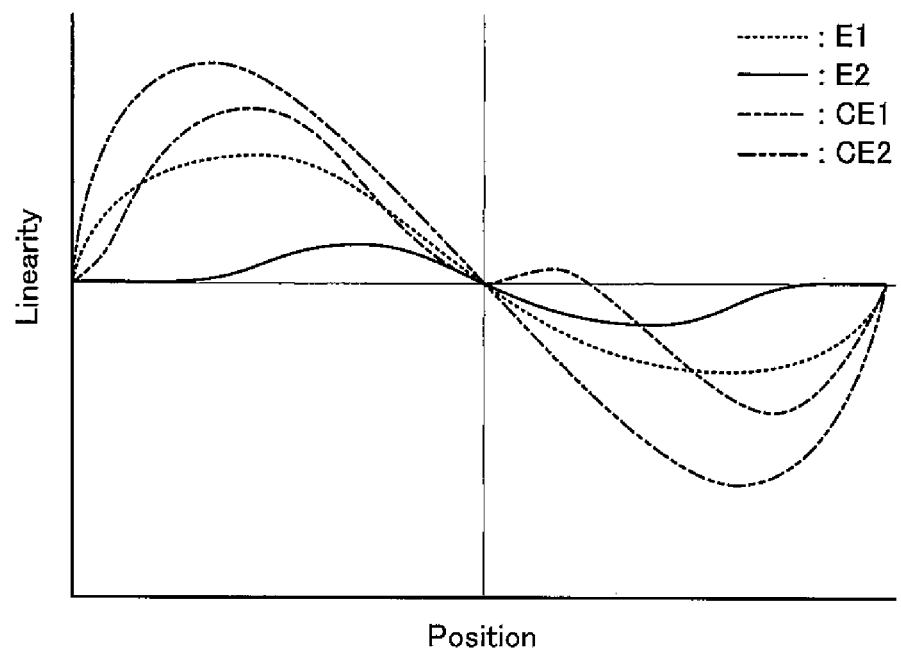
FIG. 11 is a graph showing simulation results of the linearity of change in the magnetic field intensity in the Y-axis direction with respect to change in the relative position of the magnetic detection part, using the magnetic sensor devices of Embodiment 1, Embodiment 2, Comparison Example 1 and Comparison Example 2.

In the magnetic sensor device 1 shown in FIGS. 1-3, the relationship between the relative position (Position) of the magnetic detection part 3 at the time when the multipolar magnet 2 has moved along the X-axis direction from a −X point to a +X point, and the magnetic field intensity By in the Y-axis direction applied to the magnetic detection elements R1~R4, was found through simulation. From those simulation results, the linearity (Linearity) of the change in the magnetic field intensity By with respect to change in the relative position (Position) was found (E1). In the above-described magnetic sensor device 1, the diameter of the multipolar magnet 2 was 4 mm, the thickness was 4 mm, and the gap G between the first surface 21 and the magnetic detection part 3 was 2 mm. In the initial state, the geometric center of the multipolar magnet 2 and the geometric center of the magnetic detection part 3 perfectly matched. The results are shown in FIG. 11.

Embodiment 2

The linearity (Linearity) of the change in the magnetic field intensity By with respect to change in the relative position (Position) was found in the same manner as in Embodiment 1 (E2) except that the magnetic sensor device 1 shown in FIG. 5 and FIG. 6 was used, that is, except that the multipolar magnet 2 was changed to a magnet magnetized to eight poles. The results are also shown in FIG. 11.

Comparison Example 1

The linearity (Linearity) of the change in the magnetic field intensity By with respect to change in the relative position (Position) was similarly found for a magnetic sensor device having the same configuration as in Embodiment 1 (CE1) except that the magnet (diameter: 4 mm; thickness: 4 mm) magnetized to two poles having magnetization directions in the thickness direction was used instead of the above-described multipolar magnet 2. The results are also shown in FIG. 11.

Comparison Example 2

The linearity (Linearity) of the change in the magnetic field intensity By with respect to change in the relative position (Position) was similarly found for a magnetic sensor device having the same configuration as in Embodiment 1 (CE2) except that the magnet (diameter: 2 mm; thickness: 4 mm) magnetized to two poles having magnetization directions in the thickness direction was used instead of the above-described multipolar magnet 2. The results are also shown in FIG. 11.

As is clear from the graph shown in FIG. 11, in the magnetic sensor device 1 of Embodiment 1 and Embodiment 2, the linearity of the change in the magnetic field intensity By with respect to change in the relative position (Position) is superior to that of the magnetic sensor devices of Comparison Example 1 and Comparison Example 2, and consequently it was confirmed that highly accurate position detection was possible.

Embodiment 3

The relationship between the relative position (Position) of the magnetic detection part 3 when the multipolar magnet 2 has been moved along the Y-axis direction from a −Y point to a +Y point, and the magnetic field intensity Bx in the X-axis direction applied to the magnetic detection elements R1~R4, was found through simulation using the magnetic sensor device 1 having the same configuration as in Embodiment 1, except that the magnetic detection part 3 was positioned such that the geometric center of the magnetic detection part 3 is shifted by 1.5 mm in the +X direction from the geometric center of the multipolar magnet 2 (E3). In addition, the relationship between the relative position (Position) of the magnetic detection part 3 when the multipolar magnet 2 has been moved along the X-axis direction from a −X point to a +X point, and the magnetic field intensity By in the Y-axis direction applied to the magnetic detection elements R1~R4, was similarly found through simulation (E3). Simulation results for the relationship between the relative position (Position) and the magnetic field intensity Bx are shown in FIG. 12, and simulation results for the relationship between the relative position (Position) and the magnetic field intensity By are shown in FIG. 13.

Embodiment 4

The relationship between the relative position (Position) of the magnetic detection part 3 when the multipolar magnet 2 has been moved along the Y-axis direction from a −Y point to a +Y point, and the magnetic field intensity Bx in the X-axis direction applied to the magnetic detection elements R1~R4, was found through simulation using the magnetic sensor device 1 having the same configuration as in Embodiment 2, except that the magnetic detection part 3 was positioned such that the geometric center of the magnetic detection part 3 is shifted by 1.5 mm in the −X direction from the geometric center of the multipolar magnet 2 (E4). In addition, the relationship between the relative position (Position) of the magnetic detection part 3 when the multipolar magnet 2 has been moved along the X-axis direction from a −X point to a +X point, and the magnetic field intensity By in the Y-axis direction applied to the magnetic detection elements R1~R4, was similarly found through simulation (E4). Simulation results for the relationship between the relative position (Position) and the magnetic field intensity Bx are shown in FIG. 12, and simulation results for the relationship between the relative position (Position) and the magnetic field intensity By are shown in FIG. 13.

Figure 12:
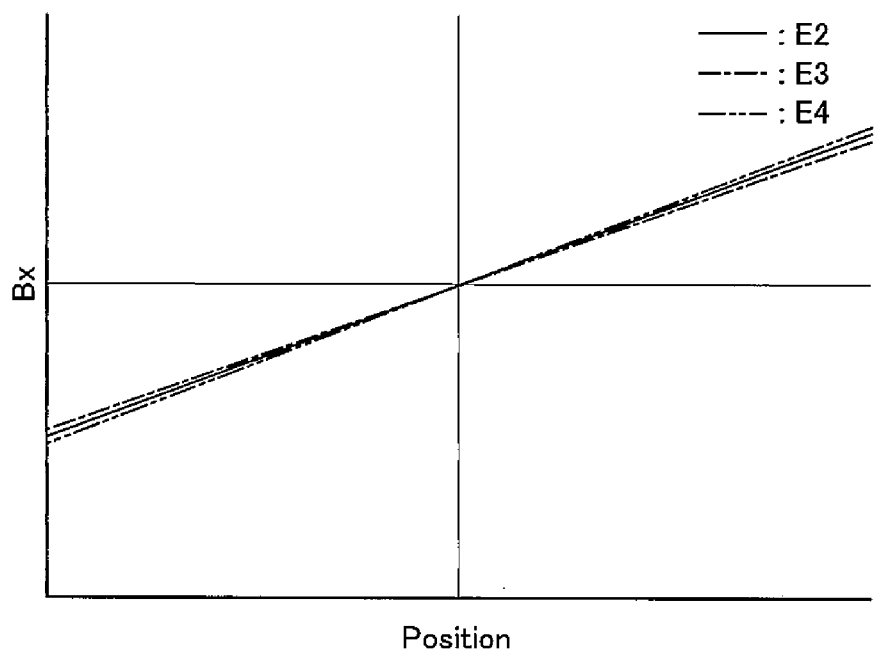
FIG. 12 is a graph showing simulation results for the relationship between the relative position of the magnetic detection part and the magnetic field intensity in the X-axis direction, using the magnetic sensor device of Embodiments 2~4.
Figure 13:
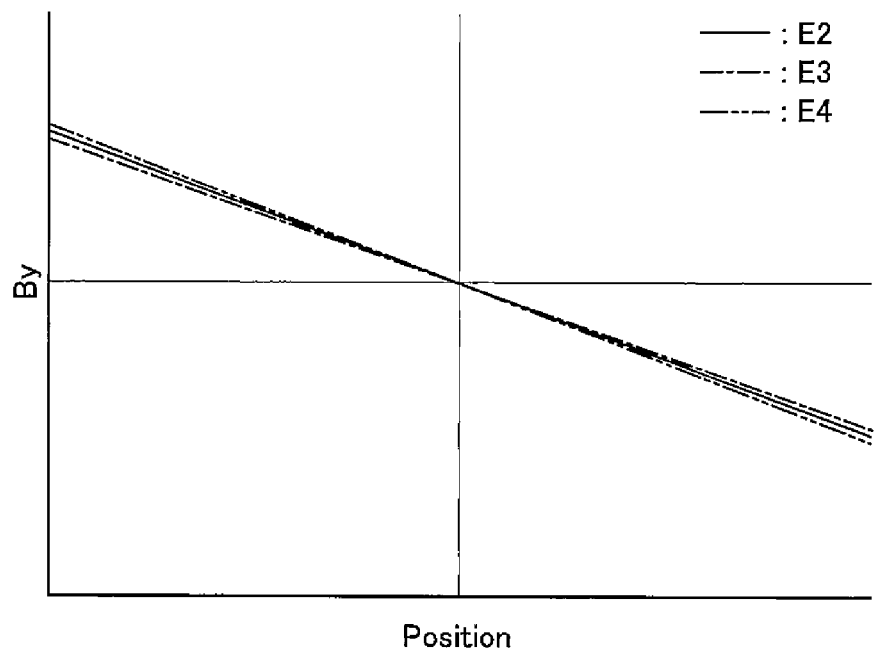
FIG. 13 is a graph showing simulation results for the relationship between the relative position of the magnetic detection part and the magnetic field intensity in the Y-axis direction, using the magnetic sensor device of Embodiments 2~4.

Simulation results of Embodiment 2 (E2) are shown in FIG. 12 and FIG. 13 as reference. As is clear from the graphs shown in FIG. 12 and FIG. 13, it was confirmed that even if the relative position (Position) of the magnetic detection part 3 was shifted, there was extremely little effect on the properties (output of the sensor signal S from the magnetic detection part 3) of the magnetic sensor device 1. As a result, there is considerable margin relative to the assembly positions of the multipolar magnet 2 and the magnetic detection part 3, so it can be said that the manufacturing the magnetic sensor device 1 is easy.

Embodiment 5

Figure 14:
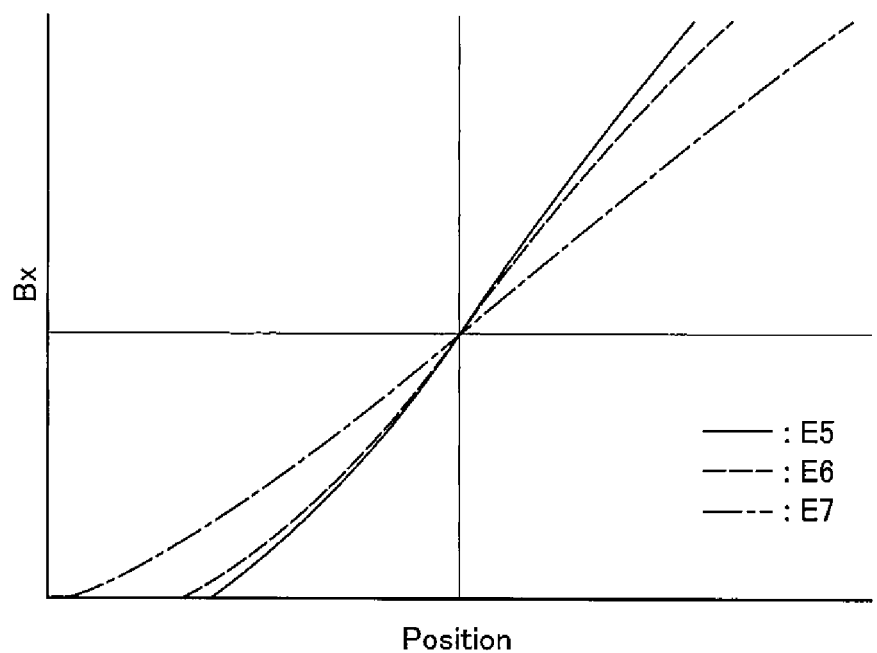
FIG. 14 is a graph showing simulation results for the relationship between the relative position of the magnetic detection part and the magnetic field intensity in the X-axis direction, using the magnetic sensor device of Embodiments 5~7.
Figure 15:
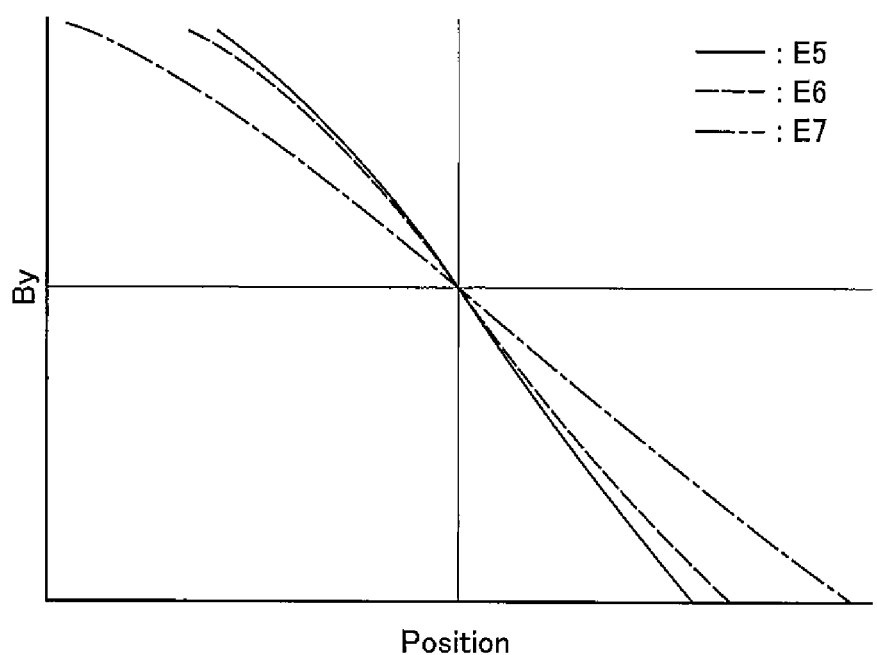
FIG. 15 is a graph showing simulation results for the relationship between the relative position of the magnetic detection part and the magnetic field intensity in the Y-axis direction, using the magnetic sensor device of Embodiments 5~7.

Using a magnetic sensor device 1 having the same configuration as Embodiment 2 except that a multipolar magnet 2 that does not have a neutral zone was provided, the relationship between the relative position (Position) of the magnetic detection part 3 and the magnetic field intensity Bx in the X-axis direction applied to the magnetic detection elements R1~R4 when the multipolar magnet 2 is caused to move along the Y-axis direction from a −Y point to a +Y point was found through simulation (E5). In addition, the relationship between the relative position (Position) of the magnetic detection part 3 and the magnetic field intensity By in the Y-axis direction applied to the magnetic detection elements R1~R4 when the multipolar magnet 2 is caused to move along the X-axis direction from a −X point to a +X point was similarly found through simulation (E5). The simulation results for the relationship between the relative position (Position) and the magnetic field intensity Bx are shown in FIG. 14, and the simulation results for the relationship between the relative position (Position) and the magnetic field intensity By are shown in FIG. 15.

Embodiment 6

The relationship between the relative position (Position) of the magnetic detection part 3 when the multipolar magnet 2 has been moved along the Y-axis direction from a −Y point to a +Y point, and the magnetic field intensity Bx in the X-axis direction applied to the magnetic detection elements R1~R4, was found through simulation using the magnetic sensor device 1 having the same configuration as in Embodiment 7, except that the magnetic detection part 3 was positioned such that the geometric center of the magnetic detection part 3 is shifted by 0.2 mm in the +Y direction from the geometric center of the multipolar magnet 2 (E6). In addition, the relationship between the relative position (Position) of the magnetic detection part 3 when the multipolar magnet 2 has been moved along the X-axis direction from a −X point to a +X point, and the magnetic field intensity By in the Y-axis direction applied to the magnetic detection elements R1~R4, was similarly found through simulation (E6). Simulation results for the relationship between the relative position (Position) and the magnetic field intensity Bx are shown in FIG. 14, and simulation results for the relationship between the relative position (Position) and the magnetic field intensity By are shown in FIG. 15.

Embodiment 7

The relationship between the relative position (Position) of the magnetic detection part 3 when the multipolar magnet 2 has been moved along the Y-axis direction from a −Y point to a +Y point, and the magnetic field intensity Bx in the X-axis direction applied to the magnetic detection elements R1~R4, was found through simulation using the magnetic sensor device 1 having the same configuration as in Embodiment 7, except that the magnetic detection part 3 was positioned such that the geometric center of the magnetic detection part 3 is shifted by 0.5 mm in the −Y direction from the geometric center of the multipolar magnet 2 (E7). In addition, the relationship between the relative position (Position) of the magnetic detection part 3 when the multipolar magnet 2 has been moved along the X-axis direction from a −X point to a +X point, and the magnetic field intensity By in the Y-axis direction applied to the magnetic detection elements R1~R4, was similarly found through simulation (E7). Simulation results for the relationship between the relative position (Position) and the magnetic field intensity Bx are shown in FIG. 14, and simulation results for the relationship between the relative position (Position) and the magnetic field intensity By are shown in FIG. 15.

As is clear from the results shown in FIG. 14 and FIG. 15, because the multipolar magnet 2 has a neutral zone 23, it is possible to make it difficult to have a large effect on the properties of the magnetic sensor device 1 (output of the sensor signal S from the magnetic detection part 3) through positional deviation of the relative position (Position) between the multipolar magnet 2 and the magnetic detection part 3.

DESCRIPTION OF REFERENCE SYMBOLS

1 Magnetic sensor device
2 Multipolar magnet
21 First surface
22 Second surface
3 Magnetic detection part
R1~R4 Magnetic detection elements

The invention claimed is:
1. A magnetic sensor device, comprising:
a multipolar magnet having a first surface and a second surface, which is opposite to the first surface and in which magnetic poles of differing polarity are arranged alternately to divide the first surface radially into n regions where n is an integer not smaller than 4; and
a magnetic detection part provided to be opposite to the first surface of the multipolar magnet;
wherein the multipolar magnet is provided to be capable of moving relative to the magnetic detection part in a first direction and/or a second direction orthogonal to the first direction in a plane substantially parallel to the first surface and the second surface,
the magnetic detection part has one bridge circuit including a first magnetic detection element part, a second magnetic detection element part, a third magnetic detection element part, and a fourth magnetic detection element part,
the magnetic detection part outputs a signal corresponding to change in the magnetic field accompanying relative movement of the multipolar magnet in the first direction and the second direction,
the geometric centers of the multipolar magnet and the magnetic detection part substantially match in a direction orthogonal to the first surface,
the multipolar magnet includes a neutral zone that is not magnetized to the polarity of either magnetic pole, between the magnetic poles of differing polarity, and
when viewed along the direction orthogonal to the first surface,
a width of the neutral zone is larger than the size of the magnetic detection part,
the neutral zone includes a plurality of neutral zone parts that extend radially from the geometric center of the multipolar magnet,
the width of the neutral zone is substantially constant,
the widths of all of the neutral zone parts are substantially the same, and the first magnetic detection element part, the second magnetic detection element part, the third magnetic detection element part and the fourth magnetic detection element part do not overlap the magnetic poles but overlap the multipolar magnet.

2. The magnetic sensor device according to claim 1, wherein the magnetic detection part is provided to have a prescribed interval from the first surface of the multipolar magnet.

3. The magnetic sensor device according to claim 2, wherein the interval between the magnetic detection part and the first surface of the multipolar magnet is 0.1~5 mm.

4. The magnetic sensor device according to claim 1, wherein each of the first to fourth the magnetic detection element parts has a magnetic detection element that includes a magnetization fixed layer in which the magnetization direction is fixed.

5. The magnetic sensor device according to claim 4, wherein:
   each of the first to fourth the magnetic detection element parts has a plurality of the magnetic detection elements; and
   the magnetization direction of the magnetization fixed layer of the magnetic detection elements of the first and second magnetic detection element parts is substantially parallel to the first direction, and the magnetization direction of the magnetization fixed layer of the magnetic detection elements of the third and fourth magnetic detection element parts is substantially parallel to the second direction.

6. The magnetic sensor device according to claim 4, wherein the magnetic detection element is a TMR element or a GMR element.

7. A magnetic sensor device, comprising:
   a multipolar magnet having a first surface and a second surface, which is opposite to the first surface and in which magnetic poles of differing polarity are arranged alternately to divide the first surface radially into n regions where n is an integer not smaller than 4; and
   a magnetic detection part provided to be opposite to the first surface of the multipolar magnet, wherein
   the multipolar magnet is provided to be capable of moving relative to the magnetic detection part in a first direction and a second direction orthogonal to the first direction in a plane substantially parallel to the first surface and the second surface,
   the magnetic detection part has one bridge circuit including a first magnetic detection element part, a second magnetic detection element part, a third magnetic detection element part, and a fourth magnetic detection element part,
   the magnetic detection part outputs a signal corresponding to change in the magnetic field accompanying relative movement of the multipolar magnet in the first direction and the second direction,
   the geometric centers of the multipolar magnet and the magnetic detection part substantially match in a direction orthogonal to the first surface,
   the multipolar magnet includes a neutral zone that is not magnetized to the polarity of either magnetic pole, between the magnetic poles of differing polarity, and
   when viewed along the direction orthogonal to the first surface,
   the first magnetic detection element part, the second magnetic detection element part, the third magnetic detection element part and the fourth magnetic detection element part do not overlap the magnetic poles but overlap the multipolar magnet, and
   even when the multipolar magnet moves in the first direction and the second direction relative to the magnetic detection part, the first magnetic detection element part, the second magnetic detection element part, the third magnetic detection element part and the fourth magnetic detection element part do not overlap the magnetic poles but overlap the multipolar magnet.

* * * * *